United States Patent
Dorf et al.

(10) Patent No.: US 11,482,402 B2
(45) Date of Patent: Oct. 25, 2022

(54) METHODS AND APPARATUS FOR PROCESSING A SUBSTRATE

(71) Applicant: APPLIED MATERIALS, INC., Santa Clara, CA (US)

(72) Inventors: Leonid Dorf, San Jose, CA (US); Rajinder Dhindsa, Pleasanton, CA (US); Olivier Luere, San Jose, CA (US); Evgeny Kamenetskiy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 173 days.

(21) Appl. No.: 17/127,838

(22) Filed: Dec. 18, 2020

(65) Prior Publication Data

US 2021/0193438 A1 Jun. 24, 2021

Related U.S. Application Data

(60) Provisional application No. 62/950,082, filed on Dec. 18, 2019.

(51) Int. Cl.
*H01J 37/32* (2006.01)
*H05H 1/46* (2006.01)

(52) U.S. Cl.
CPC ......... *H01J 37/32183* (2013.01); *H05H 1/46* (2013.01); *H01J 2237/334* (2013.01)

(58) Field of Classification Search
CPC . H01J 37/32183; H01J 2237/334; H05H 1/46
See application file for complete search history.

(56) References Cited

U.S. PATENT DOCUMENTS

| | | | |
|---|---|---|---|
| 6,261,286 | B1 | 7/2001 | Goble et al. |
| 8,192,576 | B2 | 6/2012 | Kuthi et al. |
| 10,395,944 | B2 | 8/2019 | Fung et al. |

FOREIGN PATENT DOCUMENTS

WO    WO-2011016266 A1 *  2/2011  ........ H01J 37/32082

* cited by examiner

*Primary Examiner* — Henry Luong
(74) *Attorney, Agent, or Firm* — Moser Taboada (57) ABSTRACT

Methods and apparatus for processing a substrate are provided herein. For example, an apparatus can be a controller for a high peak power radio frequency (RF) generator. The controller comprises a control logic circuit in operable communication with an RF generator operating in a burst mode, the control logic circuit configured to receive a power, P, request at a predetermined duty cycle, δ, from a plasma processing chamber, determine a peak maximum power, $P_{peak}^{max}$, based on a maximum average power, $P_{avg}^{max}$, and a maximum absolute power, $P_{abs}^{max}$, of the RF generator and the predetermined duty cycle, and transmit a control signal to the RF generator to limit a peak power, $P_{peak}$, to the plasma processing chamber based on the $P_{peak}^{max}$.

20 Claims, 5 Drawing Sheets

METHODS AND APPARATUS FOR PROCESSING A SUBSTRATE

CROSS-REFERENCE TO RELATED APPLICATIONS

This application claims the benefit of and priority to U.S. Provisional Patent Application Ser. No. 62/950,082, filed Dec. 18, 2019, the entire contents of which is incorporated herein by reference.

FIELD

Embodiments of the present disclosure generally relate to a methods and apparatus for processing a substrate, and more particularly, to methods and apparatus including control logic for a generator.

BACKGROUND

Plasma processing generators are known. For example, a typical radio frequency (RF) generator is configured to deliver an output power (or operate into) a 50 W load. Because the loads are often complex, such as a plasma discharge, a matching network is often positioned between the RF generator and the load to transform the load impedance such that an effective impedance at an output of the generator is $R_{50}=50$ W. As a result, an RF-cycle averaged output power, $P_{out}$, the output voltage amplitude, $V_p$, and the output current amplitude, $I_p$, of the RF generator are coupled via a relationship: $P_{out}=\frac{1}{2}V_p^2/R_{50}=\frac{1}{2}I_p^2*R_{50}$, where $V_p=I_p*R_{50}$. When an RF generator is used to produce a cathode sheath and accelerate ions towards a substrate in a plasma processing chamber, output voltage and current amplitudes of the RF generator can be used to determine the cathode sheath voltage. Thus, in order to produce a large cathode sheath voltage (e.g., such as for high aspect ratio (HAR) etch, deposition process, or other plasma process) an RF generator with high output power is required. However, for a number of reasons (e.g., to prevent mask clogging) such applications often require an RF generator to operate in a pulsed (or burst) mode, where the RF generator can produce a pulse-modulated constant wave (CW) output voltage and current waveforms.

For example, in a pulsed mode, the RF generator produces output voltage and delivers power to the plasma during a fraction of a pulse (burst) period, typically, called a duty cycle, e.g., $\delta<1$. During each on-phase of a burst, an RF generator delivers a constant output power $P_{peak}$. Therefore, while the output voltage and current amplitudes and the peak power $P_{peak}$ required for a specific process application may be quite high, the average power produced by the generator, $P_{avg}=\delta*P_{peak}$, may be considerably smaller than the $P_{peak}$, e.g., $P_{avg} < P_{peak}$, if the duty cycle is sufficiently low. For example, a 40 kW RF generator operating at 40% duty cycle only delivers an average output power of 16 kW. Accordingly, a size, cost, and complexity of an RF generator increases rapidly with the RF generators maximum rated average output power. That is, depending on a particular plasma process, which determines a required duty cycle, a full potential of the RF generator may not be realized.

SUMMARY

Methods and apparatus for processing a substrate are provided herein. In some embodiments, a controller for a high peak power radio frequency (RF) generator includes a control logic circuit in operable communication with an RF generator operating in a burst mode, the control logic circuit configured to receive a power, P, request at a predetermined duty cycle, $\delta$, from a plasma processing chamber, determine a peak maximum power, $P_{peak}^{max}$, based on a maximum average power, $P_{avg}^{max}$, and a maximum absolute power, $P_{abs}^{max}$, of the RF generator and the predetermined duty cycle, and transmit a control signal to the RF generator to limit a peak power, $P_{peak}$, to the plasma processing chamber based on the $P_{peak}^{max}$.

In accordance with at least some embodiments, a high peak power radio frequency generator (RF) includes a control logic circuit configured to receive a power, P, request at a predetermined duty cycle, $\delta$, from a plasma processing chamber, determine a peak maximum power, $P_{peak}^{max}$, based on a maximum average power, $P_{avg}^{max}$, and a maximum absolute power, $P_{abs}^{max}$, of the RF generator and the predetermined duty cycle, and transmit a control signal to the RF generator to limit a peak power, $P_{peak}$, to the plasma processing chamber based on the $P_{peak}^{max}$.

In accordance with at least some embodiments, a method of processing a substrate includes receiving, at control logic circuit in operable communication with an RF generator operating in a burst mode, a power, P, request at a predetermined duty cycle, $\delta$, from a plasma processing chamber, determining a peak maximum power, $P_{peak}^{max}$, based on a maximum average power, $P_{avg}^{max}$, and a maximum absolute power, $P_{abs}^{max}$, of the RF generator and the predetermined duty cycle, and transmitting a control signal to the RF generator to limit a peak power, $P_{peak}$, to the plasma processing chamber based on the $P_{peak}^{max}$.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus including control logic circuits for a RF generators are provided herein. For example, the control logic circuits can receive an input from one or more plasma processing chambers and supply RF power to the plasma processing chamber when the RF generator is operating in a burst mode at a predetermined duty cycle. A controller is configured to adjust RF power to limit a peak power, $P_{peak}$, based on a received input power, P, request at a predetermined duty cycle, δ, from the plasma processing chamber. Accordingly, the RF generators described herein are relatively small, inexpensive, and not as complex as conventional RF generators that are configured to produce the same average output power. That is, depending on a particular plasma process, which determines a required duty cycle, a full potential of the RF generators described herein can be realized.

Figure 1:
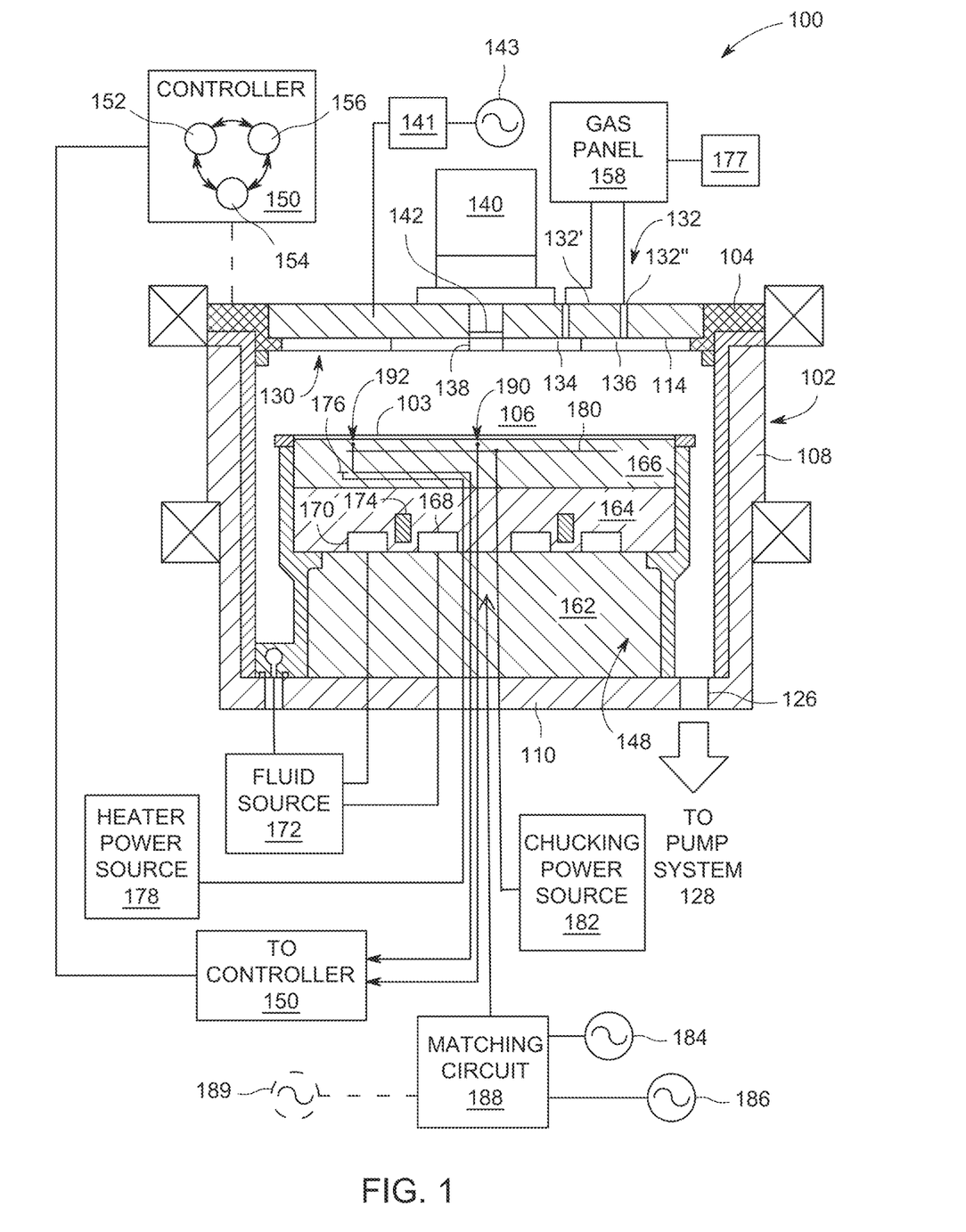
FIG. 1 is a cross-section of a processing chamber in accordance with at least some embodiments of the present disclosure.

FIG. 1 is a sectional view of one example of a processing chamber 100, e.g., a plasma processing chamber, suitable for performing one or more plasma processes (e.g., an etch process, deposition process, etc.) in accordance with the present disclosure. Suitable plasma processing chambers that may be adapted for use with the teachings disclosed herein are available from Applied Materials, Inc. of Santa Clara, Calif. Other processing chambers may be adapted to benefit from one or more of the methods of the present disclosure.

The processing chamber 100 includes a chamber body 102 and a lid 104 which enclose an interior volume 106 (e.g., a processing volume). The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

In embodiments, the lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 (e.g., a substrate base and a substrate support) through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed.

In embodiments, a gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $CO_2$, $N_2O$, $NO_2$, $O_2$, $O_3$, $H_2O$, and the like. Non-limiting examples of nitrogen containing gas includes $N_2$, $NH_3$, and the like. Non-limiting examples of chlorine containing gas includes $Cl_2$, $CCl_4$, HCl, and the like. In embodiments, a showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through inlet ports 132', 132".

In some embodiments, the substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

Figure 2:
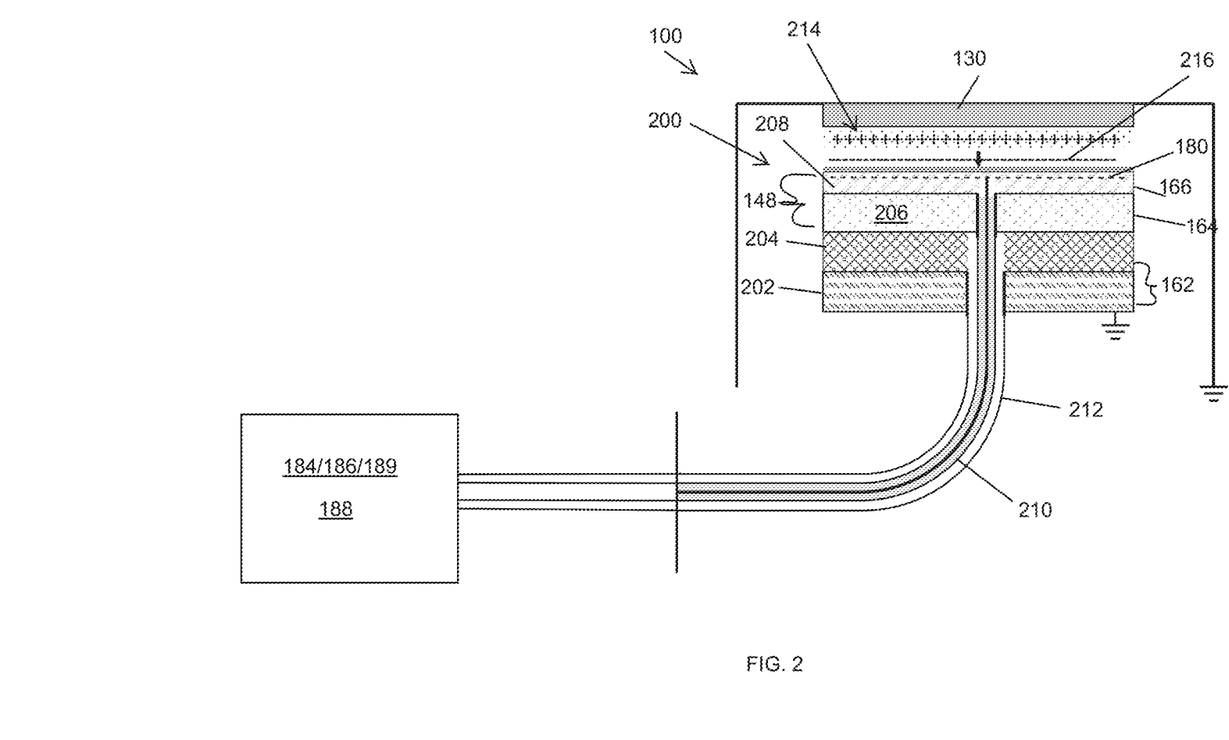
FIG. 2 is a diagram of a cathode assembly configured for use with the processing chamber of FIG. 1 in accordance with at least some embodiments of the present disclosure.

In one embodiment, the substrate support pedestal assembly 148 includes a mounting plate 162, a base 164 (e.g., a support base, facilities plate, or an RF electrode 206, FIG. 2) and an electrostatic chuck 166 (e.g., a substrate support). In at least some embodiments, the mounting plate 162 comprises a ground plate 202 that surrounds an insulating layer 204 (see FIG. 2, for example). The mounting plate 162 is coupled to the bottom 110 of the chamber body 102 and includes passages for routing utilities, such as fluids, power lines and sensor leads, among others, to the base 164 and the electrostatic chuck 166. The electrostatic chuck 166 comprises an electrode 180 (e.g., at least one clamping/chucking electrode), which can be embedded in a ceramic layer 208 (FIG. 2), for retaining the substrate 103 below showerhead assembly 130. The electrostatic chuck 166 can be driven by an optional chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

A base 164 or electrostatic chuck 166 may include at least one optional embedded heater, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

In one embodiment, the substrate support pedestal assembly 148 is configured as a cathode (e.g., a cathode 200, FIG. 2) and includes the electrode 180 and the facilities plate/RF electrode 206 that can be coupled to a plurality of RF bias power sources 184, 186. The RF bias power sources 184, 186 are coupled between the electrode 180 and facilities plate/RF electrode 206 disposed in the substrate support pedestal assembly 148 and another electrode, such as the showerhead assembly 130 or ceiling (e.g., lid 104) of the chamber body 102. The RF bias power excites and sustains a plasma 214 discharge (e.g., positive ions, FIG. 2) formed from the gases disposed in the processing region of the chamber body 102 and forms a cathode sheath 216 (e.g., negative ions) over a surface of a substrate to accelerate the positive ions towards the surface of the substrate.

Still referring to FIG. 1, in some embodiments the dual RF bias power sources 184, 186 are coupled to the electrode 180 and facilities plate/RF electrode 206 disposed in the substrate support pedestal assembly 148 through a matching circuit 188. The signal generated by the RF bias power sources 184, 186 is delivered through matching circuit 188 to the substrate support pedestal assembly 148 through a single feed (e.g., via a coaxial transmission line 210 that is covered by a grounded shield 212 (FIG. 2)) to ionize the gas mixture provided in the plasma processing chamber such as processing chamber 100, thus providing ion energy necessary for performing an etch deposition or other plasma enhanced process. The RF bias power source 184, 186 are generally capable of producing an RF signal having a frequency of from about 50 kHz to about 200 MHz and a power between about 0 Watts and about 500 Watts, 1 Watt (W) to about 100 W, or about 1 W to about 30 W. An additional bias power 189 may be coupled to the electrode 180 and facilities plate/RF electrode 206 to control the characteristics of the plasma.

During operation, the substrate 103 disposed on the substrate support pedestal assembly 148 in the plasma processing chamber such as processing chamber 100. A process gas and/or gas mixture is introduced into the chamber body 102 through the showerhead assembly 130 from the gas panel 158. A vacuum pump system such as pump system 128 maintains the pressure inside the chamber body 102 while removing deposition by-products.

A controller 150 is coupled to the processing chamber 100 to control operation (e.g., pressure, temperature, process gas supply, exhaust, etc.) of the processing chamber 100. The controller 150 includes a CPU (central processing unit) 152, a memory 154 (e.g., non-transitory computer readable storage medium), and a support circuit 156 utilized to control process sequences. The CPU 152 may be any form of general-purpose computer processor that may be used in an industrial setting. Software routines can be stored in the memory 154, such as random-access memory, read only memory, floppy, or hard disk drive, or other form of digital storage, as instructions that when executed by a processor (e.g., the CPU 152) perform one or more of the methods described herein. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Additionally, the controller 150 is configured for etch control and deposition control using one or more control algorithms which can be stored in the memory 154. For example, the controller 150 is configured to transmit control signals to control a power output from one or more RF generators, e.g., the RF bias power sources 184, 186, 189, and the RF source power 143 during operation. For example, in at least some embodiments, the controller 150 is configured to operate the one or more RF generators as high-peak power radio-frequency generators, e.g., using a control logic circuit 300 shown in FIG. 3. For illustrative purposes, the control logic circuit 300 is described herein as a component of the controller 150. Alternatively or additionally, the control logic circuit 300 can be a component of the one or more RF generators (e.g., the RF bias power sources 184, 186, 189, and the RF source power 143) and/or a matching network (e.g., the matching circuit 188).

Figure 4:
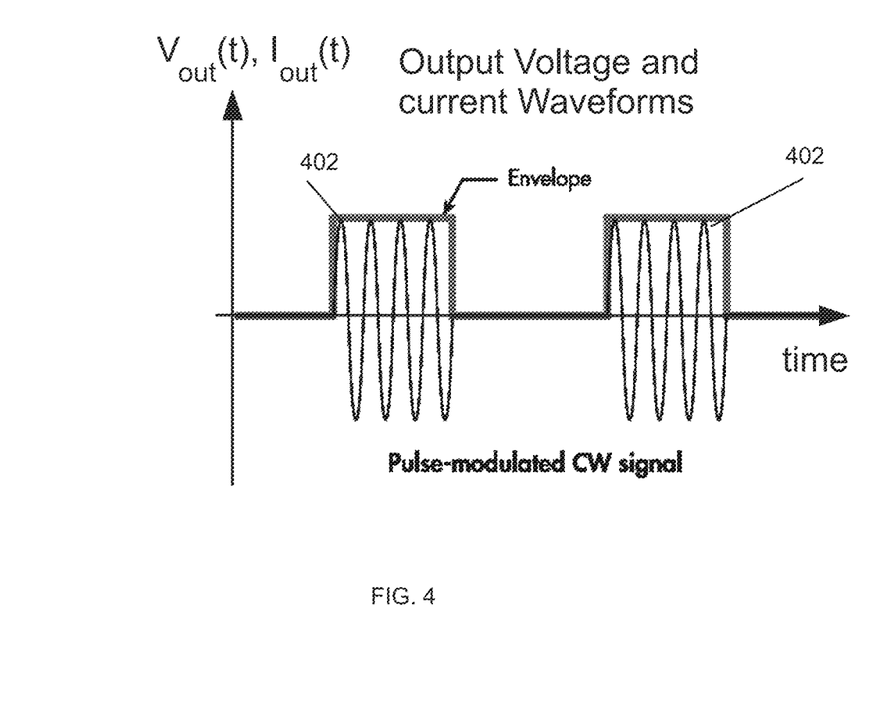
FIG. 4 is graph of output voltage and current waveforms in accordance with at least some embodiments of the present disclosure.

As noted above, in a pulsed (burst) operating mode (FIG. 4), RF generators deliver power to the plasma during a fraction of a pulse (burst) period 402 (e.g., a duty cycle, δ<1). In accordance with the instant disclosure, however, the controller 150 is configured to automatically limit a peak power, $P_{peak}$, and output amplitudes of voltage, $V_p$, and current, $I_p$, based on a maximum rated average power, $P_{avg}$, and a requested duty cycle, δ, of an RF generator. For example, the inventors have found that $P_{peak}$ can be limited to peak maximum power, $P_{peak}^{max}$ ($P_{peak}$ is equal to $P_{peak}^{max}$), using Equation (1):

$$P_{peak}^{max} = \min(P_{avg}^{max}/\delta, P_{abs}^{max}) \qquad (1)$$

where $P_{abs}^{max}$ is a maximum rated power output of an RF generator (e.g., based on a maximum output amplitude of voltage, $V_p$, and current, $I_p$), δ is a predetermined duty cycle requested by a processing chamber (e.g., a controller) for a given recipe, and $P_{avg}^{max}$ is a maximum rated average power of an RF generator. $P_{abs}^{max}$ and $P_{avg}^{max}$ are fixed values determined (e.g., a maximum rated output) based on the hardware of an RF generator. For example, the RF bias power sources 184, 186 can be characterized by two maximum rated powers, e.g., $P_{abs}^{max}$ and $P_{avg}^{max}$. Accordingly, using Equation (1), during operation the controller 150 is configured to automatically adjust output control parameters to limit a peak output power, $P_{peak}$, voltage, $V_p$, and current, $I_p$, of the RF bias power sources 184, 186 (e.g., when operated in a pulsed (burst) operating mode), based on a duty cycle and maximum ratings for average power, $P_{avg}$, $P_{abs}^{max}$, and output voltage and current, $V_p$ and $I_p$, respectively.

Figure 5:
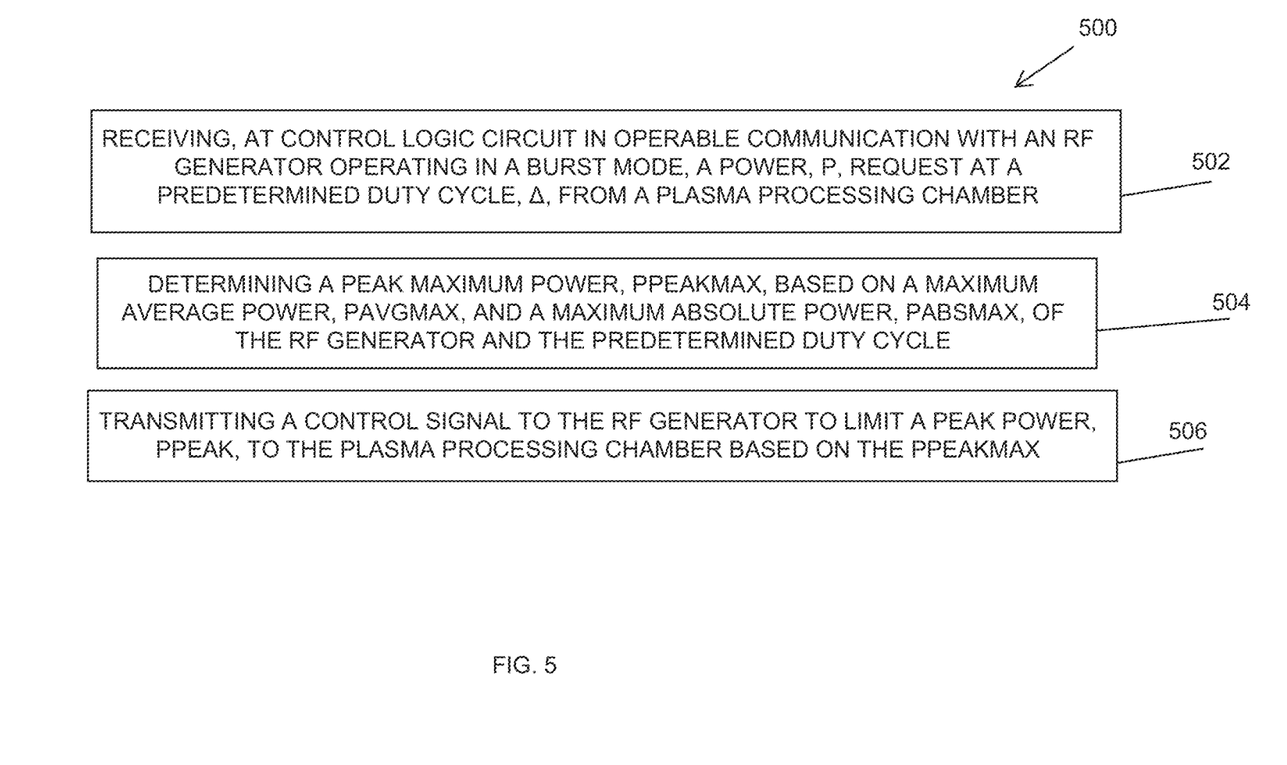
FIG. 5 is a flowchart of a method of processing a substrate in accordance with at least some embodiments of the present disclosure.

For example, FIG. 5 is a flowchart of a method 500 of processing (e.g., plasma processing) a substrate (e.g., the substrate 103) in accordance with at least some embodiments of the present disclosure. For example, in at least some embodiments, processing a substrate can comprise performing a high aspect ratio etch process on a substrate. For illustrative purposes, the method 500 is described in terms of a processing chamber (e.g., the processing chamber 100) requesting RF bias power from the RF bias power source 184 at a predetermined duty cycle, δ.

Figure 3:
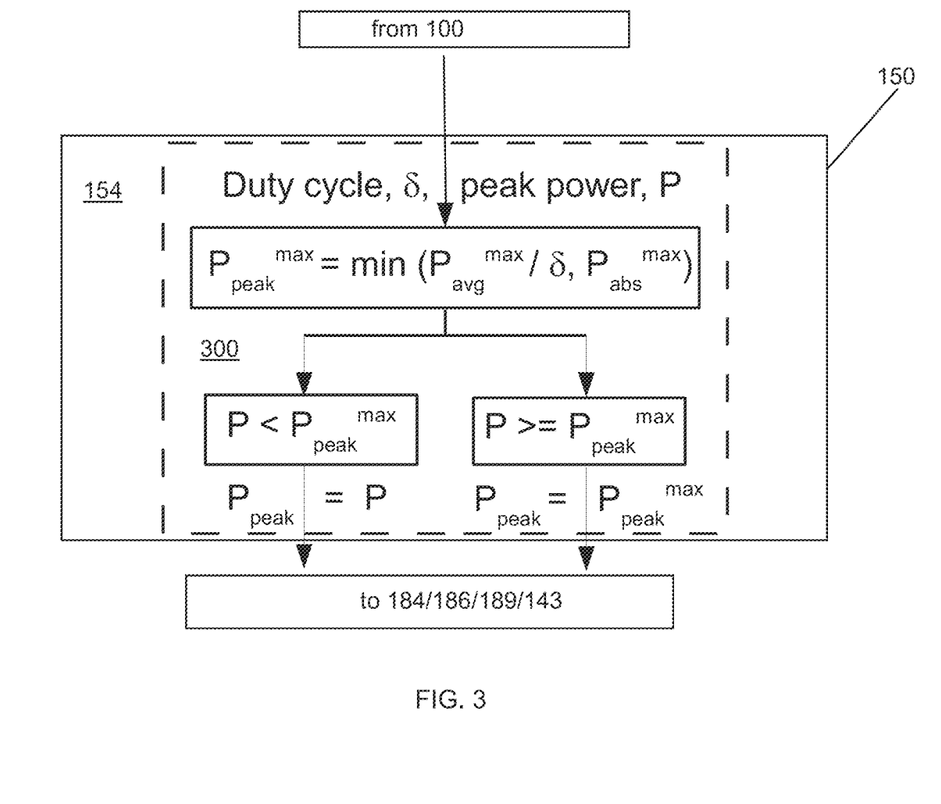
FIG. 3 is a diagram of a control logic circuit for a high peak power radio frequency generator in accordance with at least some embodiments of the present disclosure.

At 502, the method 500 comprises receiving, at control logic circuit in operable communication with an RF generator operating in a burst mode, a power, P, request (e.g., RF bias power) at a predetermined duty cycle, δ, from a plasma processing chamber. For example, during operation, in at least some embodiments, the control logic circuit 300 can receive a request for power, P, from the processing chamber 100. For example, the power, P, requested can be 10 kW of power at a duty cycle, δ, of 25% (e.g., 0.25).

Next, at 504, the method 500 comprises determining a peak maximum power, $P_{peak}^{max}$, based on a maximum average power, $P_{avg}^{max}$, and a maximum absolute power, $P_{abs}^{max}$, of the RF generator and the predetermined duty cycle. For illustrative purposes, the maximum average power, $P_{avg}^{max}$, and a maximum absolute power, $P_{abs}^{max}$, of the RF generator is assumed to be 25 kW and 50 kW, respectively. For example, using Equation (1) above, $P_{peak}^{max} = \min(P_{avg}^{max}/\delta, P_{abs}^{max})$, $P_{avg}^{max} = 25$ kW/0.25 and $P_{abs}^{max} = 50$ kW. Thus, $P_{peak}^{max} = 50$ kW, e.g., min (100 kW, 50 kW).

Next, at 506, the method 500 comprises transmitting a control signal to the RF generator to limit a peak power, $P_{peak}$, to the plasma processing chamber based on the $P_{peak}^{max}$. For example, when the power, P, is less than $P_{peak}^{max}$, the controller is configured to limit $P_{peak}=P$ (FIG. 3). Thus, since power, P, is 10 kW, which is less than $P_{peak}^{max}$ of 50 kW, the RF generator supplies a peak power, $P_{peak}$ that is equal to 10 kW.

However, at 506, when P is greater than or equal to $P_{peak}^{max}$, the controller is configured to limit $P_{peak}=P_{peak}^{max}$ (FIG. 3). For example, if the power, P, is 75 kW of power at a duty cycle, δ, of 25%, using Equation (1) above, $P_{peak}^{max} = \min(P_{avg}^{max}/\delta, P_{abs}^{max})$. Thus, $P_{peak}^{max} = 50$ kW, e.g., min (100 kW, 50 kW). In this instance, however, since power, P, is 75 kW, which is greater than $P_{peak}^{max}$ of 50 kW, the RF generator supplies a peak power, $P_{peak}$ that is equal to 50 kW.

While the foregoing is directed to embodiments of the present disclosure, other and further embodiments of the disclosure may be devised without departing from the basic scope thereof.

The invention claimed is:

1. A controller for a high peak power radio frequency (RF) generator, comprising:
   a control logic circuit in operable communication with an RF generator operating in a burst mode, the control logic circuit configured to receive a power, P, request at a predetermined duty cycle, δ, from a plasma processing chamber, determine a peak maximum power, $P_{peak}^{max}$, based on a maximum average power, $P_{avg}^{max}$, and a maximum absolute power, $P_{abs}^{max}$, of the RF generator and the predetermined duty cycle, and transmit a control signal to the RF generator to limit a peak power, $P_{peak}$, to the plasma processing chamber based on the $P_{peak}^{max}$.

2. The controller of claim 1, wherein $P_{peak}^{max}$ is determined using:

$$P_{peak}^{max} = \min(P_{avg}^{max}/\delta, P_{abs}^{max})$$

where $P_{abs}^{max}$ is a maximum rated output of the RF generator, δ is the predetermined duty cycle, and $P_{avg}^{max}$ is a maximum rated average power of the RF generator.

3. The controller of claim 1, wherein when the power, P, is less than $P_{peak}^{max}$, the control logic circuit is configured to limit $P_{peak}=P$.

4. The controller of claim 1, wherein when P is greater than or equal to $P_{peak}^{max}$, the control logic circuit is configured to limit $P_{peak}=P_{peak}^{max}$.

5. The controller of claim 1, wherein the RF generator is at least one of an RF bias power source or an RF source power.

6. The controller of claim 1, wherein the plasma processing chamber is configured to perform a high aspect ratio etch process.

7. The controller of claim 1, wherein the control logic circuit is a component of at least one of the RF generator, a controller of the plasma processing chamber, or a matching circuit coupled to the plasma processing chamber.

8. A high peak power radio frequency generator (RF), comprising:
   a control logic circuit configured to receive a power, P, request at a predetermined duty cycle, δ, from a plasma processing chamber, determine a peak maximum power, $P_{peak}^{max}$, based on a maximum average power, $P_{avg}^{max}$, and a maximum absolute power, $P_{abs}^{max}$, of the RF generator and the predetermined duty cycle, and transmit a control signal to the RF generator to limit a peak power, $P_{peak}$, to the plasma processing chamber based on the $P_{peak}^{max}$.

9. The radio frequency generator of claim 8, wherein $P_{peak}^{max}$ is determined using:

$$P_{peak}^{max}=\min(P_{avg}^{max}/\delta, P_{abs}^{max})$$

where $P_{abs}^{max}$ is a maximum rated output of the RF generator, $\delta$ is the predetermined duty cycle, and $P_{avg}^{max}$ is a maximum rated average power of the RF generator.

10. The radio frequency generator of claim 8, wherein when the power, P, is less than $P_{peak}^{max}$, the control logic circuit is configured to limit $P_{peak}=P$.

11. The radio frequency generator of claim 8, wherein when P is greater than or equal to $P_{peak}^{max}$, the control logic circuit is configured to limit $P_{peak}=P_{peak}^{max}$.

12. The radio frequency generator of claim 8, wherein the RF generator is at least one of an RF bias power source or an RF source power.

13. The radio frequency generator of claim 8, wherein the plasma processing chamber is configured to perform a high aspect ratio etch process.

14. The radio frequency generator of claim 8, wherein the control logic circuit is a component of at least one of the RF generator, a controller of the plasma processing chamber, or a matching circuit coupled to the plasma processing chamber.

15. A method of processing a substrate, comprising:
receiving, at control logic circuit in operable communication with an RF generator operating in a burst mode, a power, P, request at a predetermined duty cycle, $\delta$, from a plasma processing chamber;
determining a peak maximum power, $P_{peak}^{max}$, based on a maximum average power, $P_{avg}^{max}$, and a maximum absolute power, $P_{abs}^{max}$, of the RF generator and the predetermined duty cycle; and
transmitting a control signal to the RF generator to limit a peak power, $P_{peak}$, to the plasma processing chamber based on the $P_{peak}^{max}$.

16. The method of claim 15, wherein $P_{peak}^{max}$ is determined using:

$$P_{peak}^{max}=\min(P_{avg}^{max}/\delta, P_{abs}^{max})$$

where $P_{abs}^{max}$ is a maximum rated output of the RF generator, $\delta$ is the predetermined duty cycle, and $P_{avg}^{max}$ is a maximum rated average power of the RF generator.

17. The method of claim 15, further comprising when the power, P, is less than $P_{peak}^{max}$, limiting $P_{peak}=P$.

18. The method of claim 15, further comprising when P is greater than or equal to $P_{peak}^{max}$, limiting $P_{peak}=P_{peak}^{max}$.

19. The method of claim 15, wherein the RF generator is at least one of an RF bias power source or an RF source power.

20. The method of claim 15, further comprising performing a high aspect ratio etch process.

* * * * *